US009941882B1

(12) United States Patent
Lewis

(10) Patent No.: US 9,941,882 B1
(45) Date of Patent: Apr. 10, 2018

(54) TRISTATE MULTIPLEXERS WITH IMMUNITY TO AGING EFFECTS

(71) Applicant: Altera Corporation, San Jose, CA (US)

(72) Inventor: David Lewis, Toronto (CA)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 15/213,031

(22) Filed: Jul. 18, 2016

(51) Int. Cl.
*H03K 19/003* (2006.01)
*H03K 19/00* (2006.01)
*H03K 19/173* (2006.01)

(52) U.S. Cl.
CPC ... *H03K 19/00384* (2013.01); *H03K 19/0002* (2013.01); *H03K 19/1737* (2013.01)

(58) Field of Classification Search
None
See application file for complete search history.

(56) References Cited

U.S. PATENT DOCUMENTS

| | | | |
|---|---|---|---|
| 5,682,110 A * | 10/1997 | Rountree | H03K 19/09429 326/113 |
| 7,338,817 B2 | 3/2008 | Liu et al. | |
| 7,423,452 B1 * | 9/2008 | Chirania | H03K 19/1737 326/38 |
| 7,531,836 B2 | 5/2009 | Liu et al. | |
| 8,102,190 B2 | 1/2012 | Masleid | |
| 8,581,758 B2 * | 11/2013 | Teramoto | H03K 19/00361 327/408 |
| 8,587,344 B2 | 11/2013 | Masleid | |
| 8,791,720 B2 | 7/2014 | Chern et al. | |
| 9,160,321 B2 | 10/2015 | Masleid | |
| 2003/0080800 A1 * | 5/2003 | Kuttner | H03F 1/34 327/408 |
| 2015/0236698 A1 * | 8/2015 | Pedersen | H03K 19/00384 326/8 |
| 2016/0036428 A1 * | 2/2016 | Wang | H03K 19/17772 327/437 |

* cited by examiner

*Primary Examiner* — Douglas W Owens
*Assistant Examiner* — James H Cho
(74) *Attorney, Agent, or Firm* — Treyz Law Group, P.C.; Jason Tsai

(57) ABSTRACT

An integrated circuit with programmable logic is provided. The programmable logic may include multiplexers that are actively used by a custom logic design or unused. To ensure that these multiplexers do not suffer from aging effects when they are not in use, the multiplexers may be provided with aging prevention circuitry. In particular, such a multiplexer may include an input selection stage that is coupled in series with a tristate buffer stage. The input selection stage may include pass transistors or full CMOS transmission gates. The tristate buffer stage may include at least two pairs of output driving transistors, with gates that are selectively shorted when the multiplexer is activated using additional transmission gate circuits. The aging prevention circuitry may include tie-off transistors that are activated to drive the gate-to-source voltages of the output driving transistors to zero volts whenever the multiplexer is not in use.

11 Claims, 11 Drawing Sheets

TRISTATE MULTIPLEXERS WITH IMMUNITY TO AGING EFFECTS

BACKGROUND

Modern integrated circuits may suffer from aging effects such as bias temperature instability (BTI) and hot carrier injection (HCI). Such aging effects may cause the behavior of transistors to degrade over time. For example, BTI will cause the threshold voltage of a transistor to change as a result of continued application of a high gate-to-source voltage on that transistor. Although this effect may be mitigated to some extent by reducing the voltage stress, this would reduce the performance of the circuit.

Integrated circuits such as programmable logic devices (PLD) often include performance critical circuits that are particularly vulnerable to aging effects. Programmable integrated circuits can be programmed by a user to implement a desired custom logic function. In particular, programmable integrated circuits include memory elements that are loaded with configuration data. These memory elements supply corresponding static control signals. The programmable integrated circuit includes programmable logic that receives the static control signals for long periods of time (e.g., static control signals having fixed polarities for six months or more).

For example, a PLD may be initially configured in a first state, with some portion of the programmable logic predominantly in one state or unused. Portions of the programmable logic that are biased to one state or are unused are especially prone to aging effects. After some time (e.g., a year or more), that PLD may be reconfigured to use the programmable logic as a clock or other delay-sensitive circuit. In this case, aged and unaged logic circuits may both be used in the same clock structure, thereby causing clock skew.

It is within this context that the embodiments herein arise.

SUMMARY

An integrated circuit such as a programmable integrated circuit may be provided with a multiplexing circuit. The multiplexing circuit may be operable in: (1) an active mode where it is actively used by a custom logic design to pass through data signals and (2) a tristate mode where it is not actively being utilized by the user design. The multiplexing circuit may include an input selection stage and a tristate buffer stage that are connected in series. The tristate buffer stage may include output driving transistors and associated aging prevention circuitry that nullifies or suppresses any gate-to-source voltage on the driving transistors (e.g., aging prevention or "tie-off" transistors for selectively driving the gate-to-source voltage on the driving transistors to zero volts).

The input selection stage may include a first group of selection transistors coupled to a first intermediate node and a second group of selection transistors coupled to a second intermediate node. The first group may include only pass transistors of a first channel type, whereas the second group may include only pass transistors of a second channel type that is different than the first channel type. In another suitable arrangement, the first and second groups may both include full transmission gates. In yet another suitable arrangement, the second group of the selection transistors may be omitted.

The output driving transistors of the tristate buffer stage may include a first pull-up transistor with a gate that is connected to the first intermediate node, a first pull-down transistor with a gate that is connected to the second intermediate node, a second pull-up transistor with a gate that is connected to the first pull-up transistor, and a second pull-down transistor with a gate that is connected to the first pull-down transistor. A first transmission gate may be coupled between the gates of the first pull-up transistor and the first pull-down transistor. A second transmission gate may be coupled between the gates of the second pull-up transistor and the second pull-down transistor.

In particular, the aging prevention circuitry may include a first tie-off transistor for selectively driving the gate of the first pull-up transistor to a positive power supply voltage level during the tristate mode, a second tie-off transistor for selectively driving the gate of the first pull-down transistor to a ground power supply voltage level during the tristate mode, a third tie-off transistor for selectively driving the gate of the second pull-up transistor to the positive power supply voltage level during the tristate mode, and a fourth tie-off transistor for selectively driving the gate of the second pull-down transistor to the ground power supply voltage level during the tristate mode.

The tie-off transistors and the two transmission gates in the buffer stage may be controlled using an enable signal. During the active mode, the enable signal is asserted to turn on the two transmission gates and to turn off the tie-off transistors. During the tristate mode, the enable signal is deasserted to turn off the two transmission gates and to turn on the tie-off transistors to eliminate the gate-to-source voltages on the output driving transistors (i.e., the first and second pull-down transistors and the first and second pull-up transistors).

Further features of the invention, its nature and various advantages will be more apparent from the accompanying drawings and following detailed description.

DETAILED DESCRIPTION

Embodiments of the present invention relate to integrated circuits and, more particularly, to programmable integrated circuits with aging prevention circuitry.

Programmable integrated circuits may include switching circuitry such as multiplexers. The multiplexers may be implemented as tristate multiplexers. The tristate multiplexers may include a selection stage and a tristate buffer stage. The selection stage may include some combination of n-channel and p-channel pass transistors. The tristate buffer stage may include aging prevention circuitry that is selectively enabled to drive the gate-to-source voltage on the transistors in the tristate buffer stage to zero volts. Configured in this way, stress within the multiplexer is completely removed when not in use, thereby eliminating the possibility of aging effects.

It will be recognized by one skilled in the art, that the present exemplary embodiments may be practiced without some or all of these specific details. In other instances, well-known operations have not been described in detail in order not to unnecessarily obscure the present embodiments.

Figure 1:
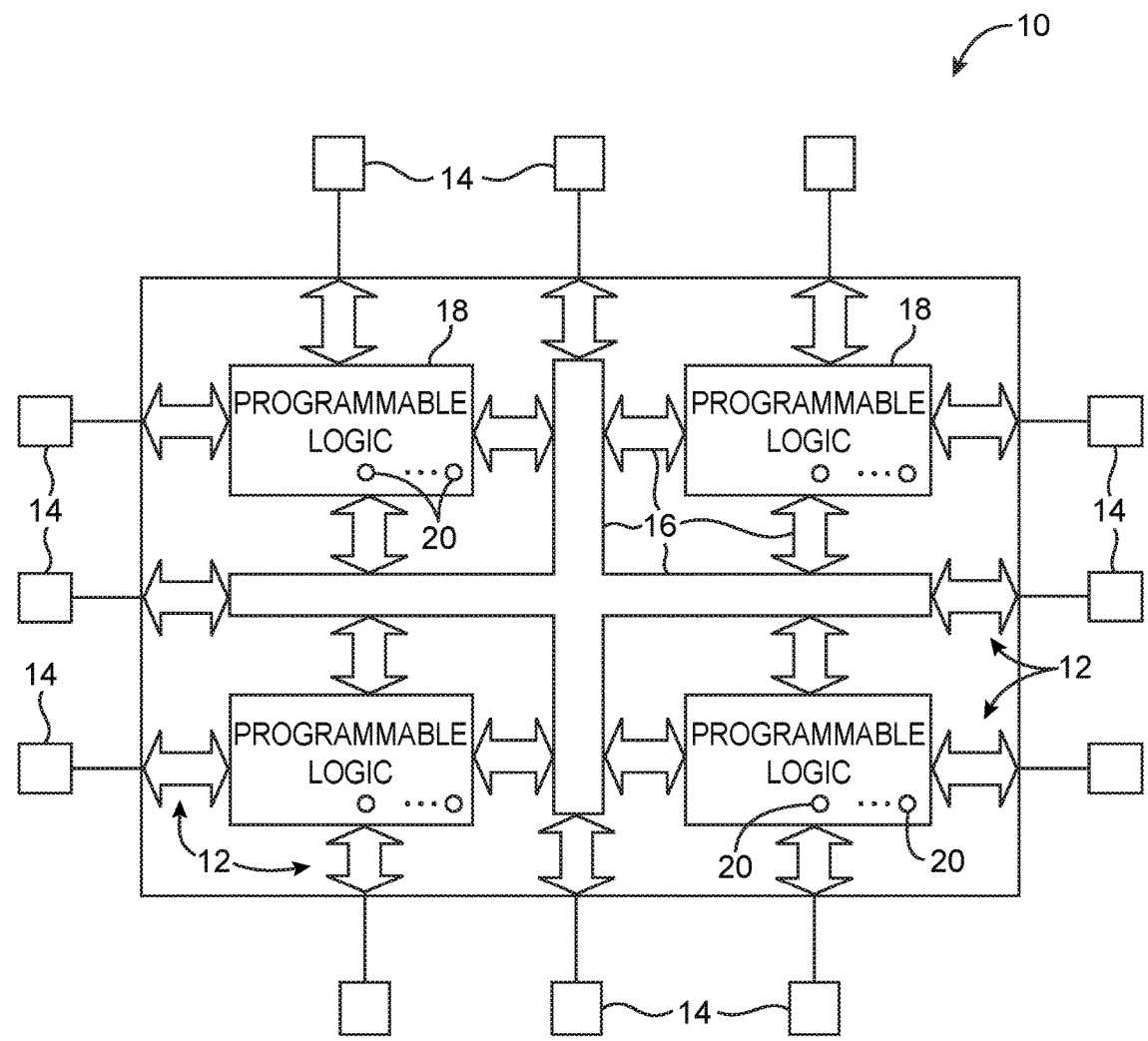
FIG. 1 is a diagram of an illustrative programmable integrated circuit in accordance with an embodiment.

FIG. 1 shows a diagram of an illustrative programmable integrated circuit device. As shown in FIG. 1, device 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 include fixed interconnects (conductive lines) and programmable interconnects (i.e., programmable connections between respective fixed interconnects). Interconnection resources 16 may sometimes be referred to herein as interconnects (e.g., interconnects formed from combinations of fixed interconnects and programmable interconnects).

Interconnects 16 may be used to interconnect regions of programmable logic such as programmable logic regions 18. Programmable logic regions 18 may sometimes be referred to as logic array blocks or programmable circuit regions. Programmable logic regions 18, may, if desired, contain groups of smaller logic regions. These smaller logic regions, which may sometimes be referred to as logic elements or adaptive logic modules, may be interconnected using local interconnection resources.

Programmable logic regions 18 may include combinational and sequential logic circuitry. For example, programmable logic regions 18 may include look-up tables, registers, and multiplexers. Programmable logic regions 18 may be configured to perform one or more custom logic functions.

Programmable logic regions 18 contain programmable elements 20. Programmable elements 20 may be based on any suitable programmable technology, such as fuses, antifuses, electrically-programmable read-only-memory technology, random-access memory cells, mask-programmed elements, etc. As an example, programmable elements 20 may be formed from memory cells. During programming, configuration data is loaded into the memory cells using pins 14 and input-output circuitry 12. The memory cells are typically random-access-memory (RAM) cells. Because the RAM cells are loaded with configuration data, they are sometimes referred to as configuration RAM cells (CRAM).

Programmable elements 20 may be used to provide static control output signals for controlling the state of logic components in programmable logic 18. The output signals generated by elements 20 are typically applied to gates of metal-oxide-semiconductor (MOS) transistors (sometimes referred to as pass gate transistors).

The circuitry of device 10 may be organized using any suitable architecture. As an example, logic 18 of programmable device 10 may be organized in a series of rows and columns of larger programmable logic regions, each of which contains multiple smaller logic regions. The logic resources of device 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the logic of device 10 may be arranged in more levels or layers in which multiple large regions are interconnected to form still larger portions of logic. Other device arrangements may use logic that is not arranged in rows and columns.

Figure 2:
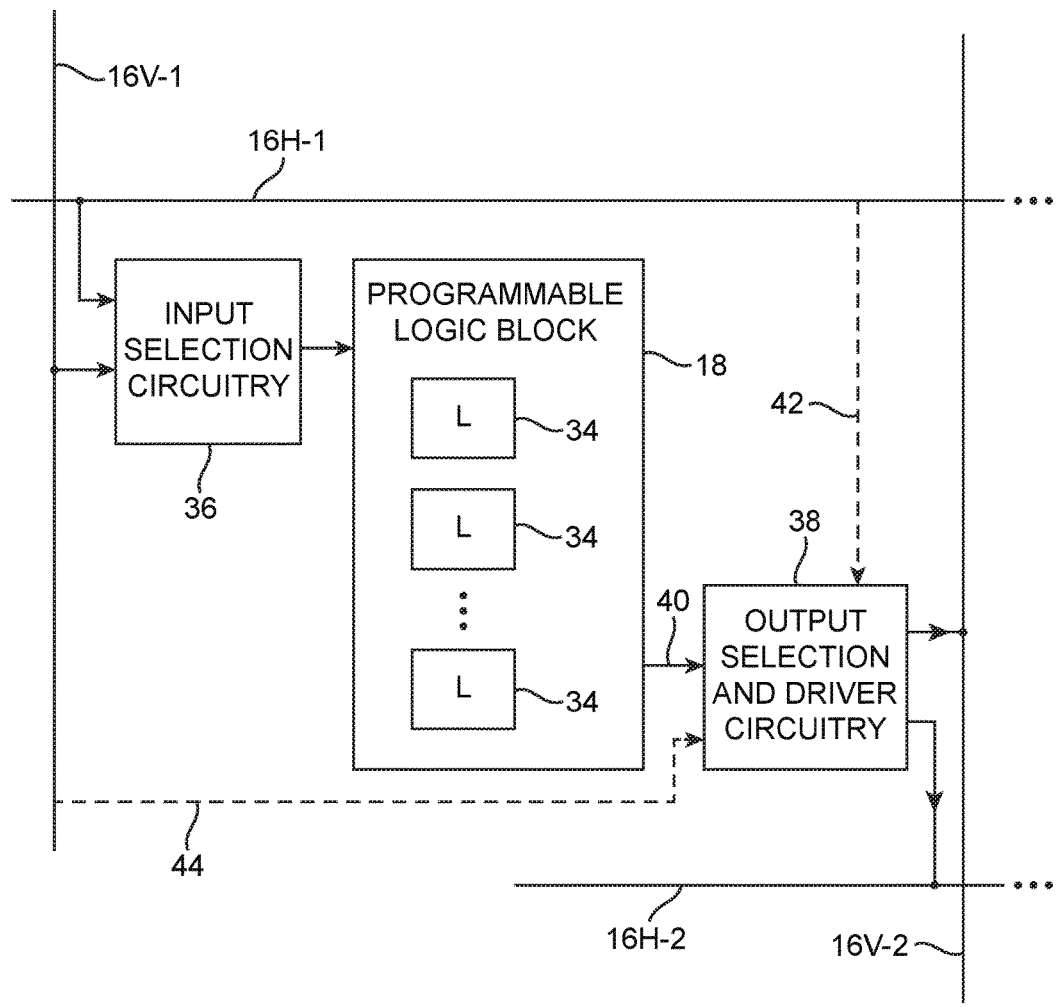
FIG. 2 is a diagram of an illustrative programmable logic block with input selection and output selection circuitry in accordance with an embodiment.

An illustrative programmable logic region 18 including a group of multiple smaller logic regions 34 is shown in FIG. 2. Programmable logic region 18, sometimes referred to as a logic array block (LAB), may have associated input selection circuitry 36 and output selection and driver circuitry 38. Input selection circuitry 36 and output selection and driver circuitry 38 may be formed as part of input-output circuits such as input-output circuits 12 of FIG. 1.

Input selection circuitry 36 may receive input signals via a first set of horizontal interconnects 16H-1 and a first set of vertical interconnects 16V-1. For example, interconnects 16H-1 may provide input signals to programmable logic block 18 from other programmable logic blocks 18 in the same row or from input/output pins 14, whereas interconnects 16V-1 may provide input signals to programmable logic block 18 from other logic blocks 18 in the same column or from pins 14. Input selection circuitry 36 may be configured (e.g., by programming CRAM bits that are associated with input selection circuitry 36) to select one or more of the input signals to provide to programmable logic block 18.

As shown in FIG. 2, programmable logic block 18 may include smaller regions of programmable logic 34. The smaller programmable logic regions 34 within each programmable logic region 18 are sometimes referred to as adaptive logic modules ("ALMs") or logic elements ("LEs"). Logic elements 34 may receive the input signals that are selected by input selection circuitry 36 and may perform custom functions on the input signals to produce output signals. The input signals received by each logic element 34 may overlap with input signal portions received by other logic elements 34 (e.g., some of the input signals received by a first logic region 34 may also be received by a second logic region 34). There may be any suitable number of logic elements 34 within logic block 18.

The output signals may be provided to output selection and driver circuitry 38 via output paths 40. Output selection and driver circuitry 38 may receive output signals via paths 40 and may be configured to provide the output signals to a second set of horizontal interconnects 16H-2 and a second set of vertical interconnects 16V-2.

If desired, output selection circuitry 38 may be configured to disconnect one or more of interconnects 16H-2 or 16V-2 (e.g., by providing no output signal or by providing a high impedance output). If desired, output selection circuitry 38 may be configured to provide a given output signal to multiple interconnects. For example, it may be desirable to route an output signal from a given logic element 34 to two different regions of integrated circuit 10. In this scenario, output selection and driver circuitry 38 may provide that output signal to two different interconnects of different lengths.

In some arrangements, input selection circuitry 36 may include LAB input multiplexers (LIMs) that can be used to select signals from a horizontal channel, a vertical channel, and local outputs from one or more logic elements 34 and to drive a set of LAB lines. The input selection circuitry 36 may also include logic element input multiplexers (LEIMs)

that can be used to select signals from some set of LAB lines and to drive the selected signals to logic elements 34. Output selection circuitry 38 may include driver input multiplexers (DIMs) that can be used to select signals from a horizontal channel, a vertical channel, and local outputs from one or more logic elements and to drive wires, which originate in that logic block 18 and route to other logic blocks 18.

Figure 3:
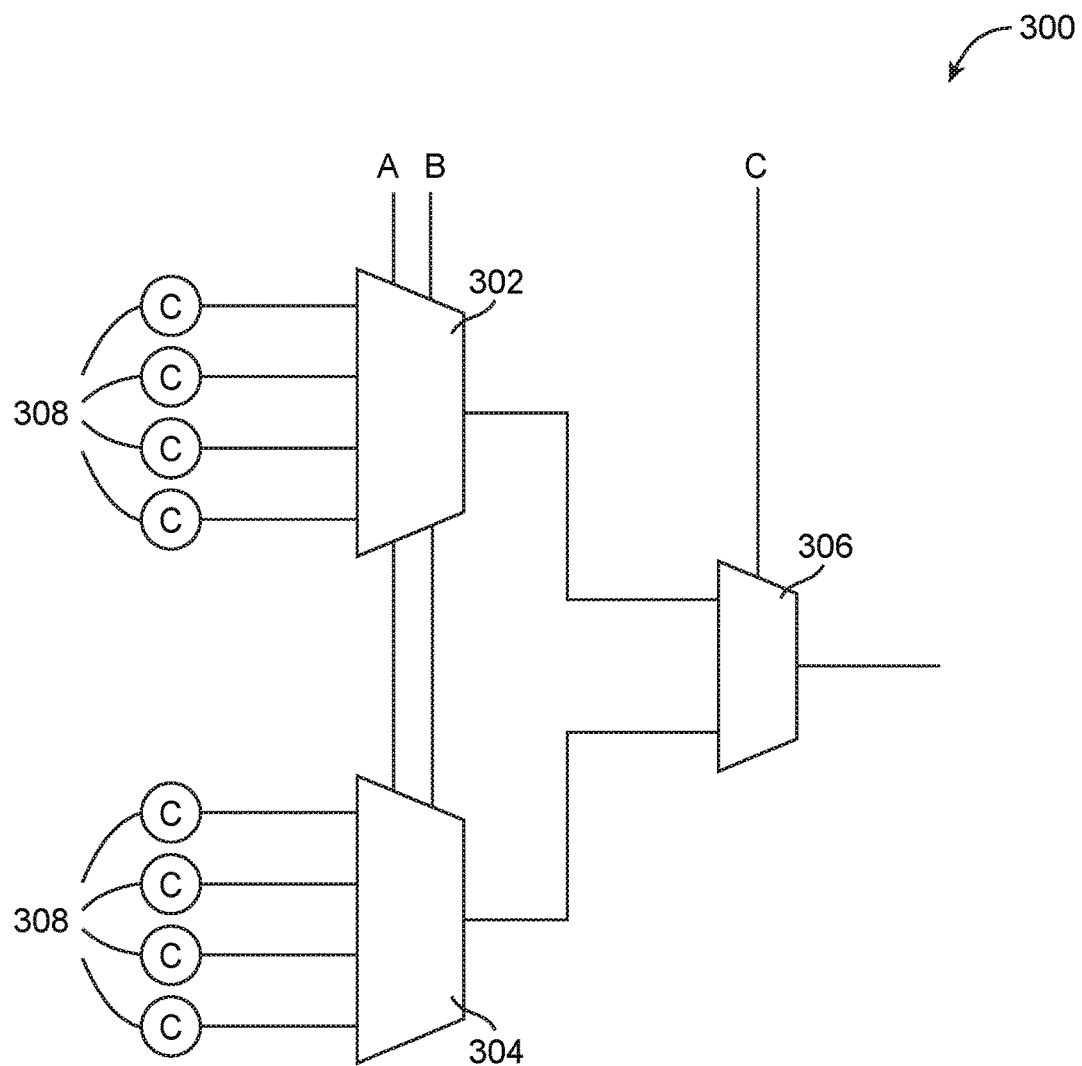
FIG. 3 is a diagram of an illustrative lookup table circuit in accordance with an embodiment.

Logic element 34 may include lookup table circuitry. FIG. 3 is a diagram of an illustrative lookup table circuit such as 3-input lookup table ("LUT") 300. As shown in FIG. 3, lookup table 300 may be implemented using multiple stages of multiplexers. The first multiplexing stage may include a first 4-input multiplexer 302 and a second 4-input multiplexer 304, whereas the second multiplexing stage may include a 2-input multiplexer 306. Multiplexers 302 and 304 may have data inputs that receive control bits from configuration memory cells 308. Depending on the value of the control bits stored in memory cells 308, a variety of different logic functions can be implemented by LUT circuit 300. Multiplexers 302 and 304 may each have an output that is connected to the data inputs of multiplexer 306.

Multiplexers 302 and 304 may have control inputs that receive input signals A and B, whereas multiplexer 306 may have a control input that receives input signal C. The three input signals A, B, and C effectively select which of the eight static logic values is being passed through to the output of LUT circuit 300. Arranged in this way, LUT 300 can be configured to support up to 256 (i.e., 2 to the power of 8) possible functions for the three input signals. The example of FIG. 3 in which a 3-input lookup table is implemented using multiplexers is merely illustrative. In general, programmable integrated circuit 10 (FIG. 1) may include lookup table circuitry with any suitable number of inputs (e.g., 4-input LUTs, 8-input LUTs, 16-input LUTs, etc.) implemented using multiplexing circuits.

Figure 4:
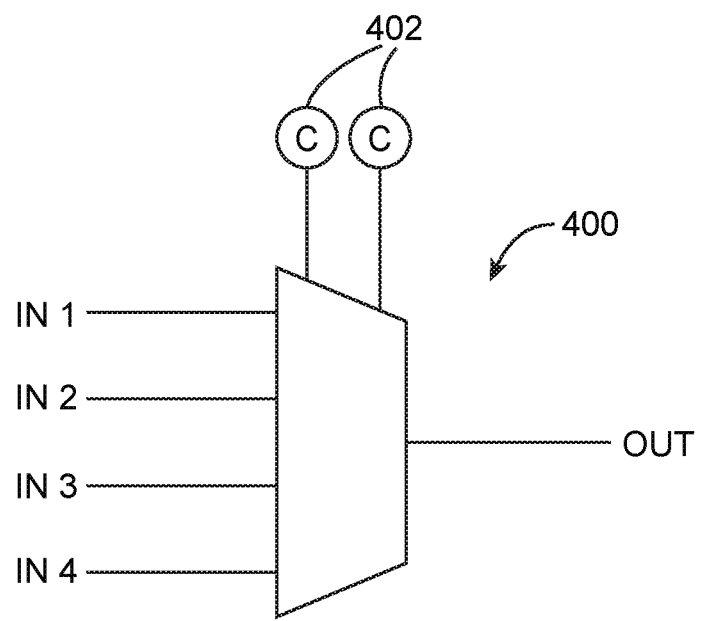
FIG. 4 is a diagram of an illustrative routing multiplexer in accordance with an embodiment.

Programmable integrated circuit 10 may also include routing multiplexers such as routing multiplexer 400 of FIG. 4. FIG. 4 shows a 4-input routing multiplexer 400 that can be used a part of input selection circuitry 36 or output selection circuitry 38 (see, e.g., FIG. 2). As shown in FIG. 4, routing multiplexer 400 may have four inputs that receive user input signals IN1-IN4 and control inputs that are coupled to configuration memory elements 402. Depending on the value of static control bits stored in memory elements 402, routing multiplexer 400 may be configured to route a selected one of user signals IN1-IN4 to the output of multiplexer 400. Thus, in contrast to a lookup table where the configuration bits are used to define a particular logic function, routing multiplexer 400 is used to perform interconnect routing for active user signals.

The example of FIG. 4 in which routing multiplexer 400 has four inputs is merely illustrative. In general, programmable integrated circuit 10 (FIG. 1) may include routing multiplexers with any suitable number of inputs (e.g., 2-input routing muxes, 8-input routing muxes, 16-input routing muxes, etc.).

Figure 5:
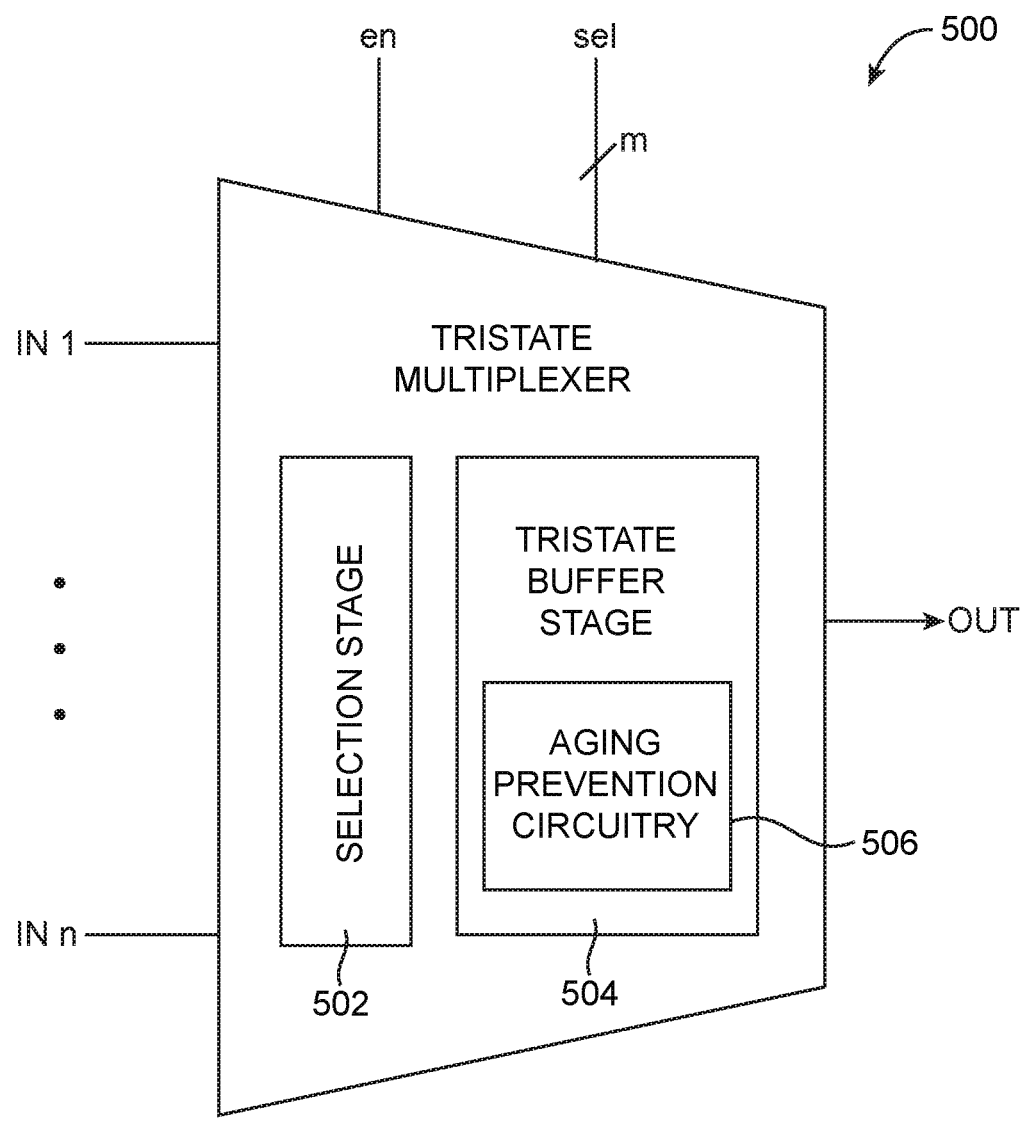
FIG. 5 is a diagram of an illustrative tristate multiplexing circuit that includes a tristate buffer stage with aging prevention circuitry in accordance with an embodiment.

As shown in the examples of FIGS. 3 and 4, a multiplexer is a basic building block of programmable device 10. In accordance with an embodiment, device 10 may be provided with an improved multiplexing circuit such as tristate multiplexer 500 that is immune to aging effects when multiplexer 500 is unused. As shown in FIG. 5, tristate multiplexer 500 may receive n input signals IN1-INn, m select signals for controlling which of the n input signals to route to the output terminal, and an enable control input for receiving enable signal en.

Tristate multiplexer 500 may be placed in an active mode when it is being used by the current user design to carry out a portion of the custom function by asserting signal en (i.e., by driving signal en high). When multiplexer 500 is not being used by the current user design (i.e., when multiplexer 500 is "unused"), multiplexer 500 may be placed in a tristate mode by deasserting signal en (i.e., by driving signal en low).

Still referring to FIG. 5, tristate multiplexer 500 may include an input selection stage 502 and a tristate buffer stage 504. Tristate buffer stage 504 may also be provided with aging prevention circuitry 506 that is selectively activated when multiplexer 500 is placed in the tristate mode (e.g., when signal en is deasserted). Use of aging prevention circuitry 506 helps to ensure that transistors (at least within the buffer stage) do not suffer from undue stress when multiplexer 500 is not actively being used by the current user design.

Figure 6:
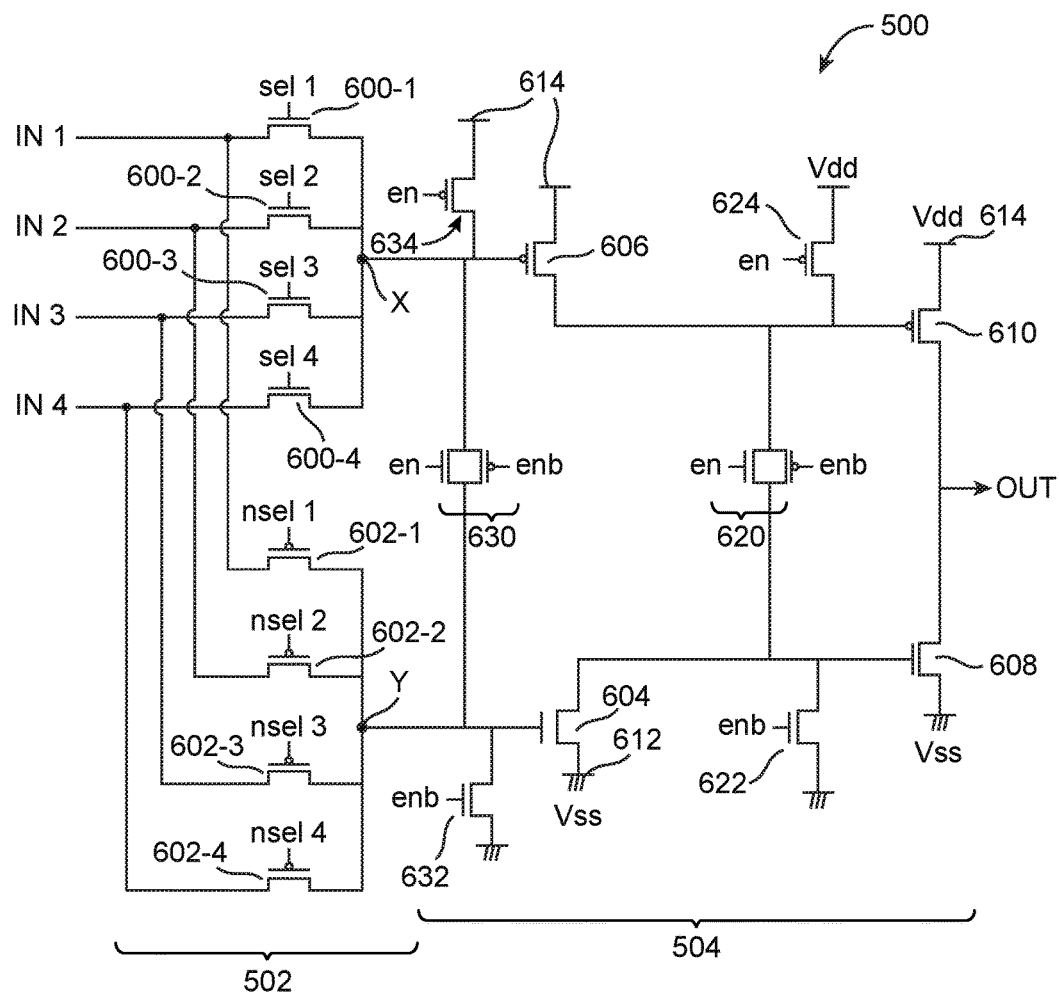
FIGS. 6-10 are circuit diagrams showing various suitable implementations of a tristate multiplexer of the type shown in FIG. 5 in accordance with an embodiment.

FIG. 6 shows one suitable arrangement of tristate multiplexer 500. As shown in FIG. 6, input selection stage 502 of multiplexer 500 may include n-channel pass transistors 600-1, 600-2, 600-3, and 600-4 and p-channel pass transistors 602-1, 602-2, 602-3, and 602-4. In particular, the n-channel transistors 600 and p-channel transistors 602 are split into two separate multiplexing portions. The first multiplexing portion only includes re-channel pass transistors 600 that selectively route one of input signals IN1-IN4 to intermediate node X (e.g., by selectively asserting only one of control signals sel1-sel4). Similarly, the second multiplexing portion only includes p-channel pass transistors 602 that selectively route one of input signals IN1-IN4 to intermediate node Y (e.g., by selectively asserting only one active-low signals nsel1-nsel4, which are simply inverted versions of sel1-sel4).

Tristate buffer stage 504 may include an n-channel pull-down transistor 604 having a gate that is coupled to node Y, a p-channel pull-up transistor 606 having a gate that is coupled to node X, and an n-channel pull-down transistor 608 that is coupled in series with p-channel pull-up transistor 610 between positive power supply terminal 614 (e.g., a power line on which positive power supply voltage Vdd is provided) and ground power supply terminal 612 (e.g., a power line on which ground power supply voltage Vss is provided). Transistor 608 may have a gate that is coupled to ground line 612 via transistor 604, whereas transistor 610 may have a gate that is coupled to positive power supply line 614 via transistor 606.

Still referring to FIG. 6, a transmission gate 620 (e.g., a transistor pair with an n-channel transistor and a p-channel transistor coupled in parallel) may be coupled between the gate terminals of transistors 610 and 608. Transmission gate 620 is turned on whenever signal enable is asserted. Configured in this way, transmission gate 620 will help pull the gate of transistor 608 up high when node X is low or will help pull the gate of transistor 610 down low when node Y is high. Because input selection stage 502 is split, an additional transmission gate 630 may be coupled between the gate terminals of transistors 604 and 606. Transmission gate is also turned on whenever signal enable is asserted. Arranged as such, transmission gate 630 will help pull node Y all the way down to Vss when node X is low or will help pull node X all the way up to Vdd when node Y is high. Transistors 604, 606, 608, and 610 that are used to drive the output of multiplexer 500 are sometimes referred to as driving transistors.

When multiplexer 500 is not in use, signal en may be deasserted (i.e., signal en is driven low while corresponding inverted signal enb is driven high). Signal enb is an inverted version of signal en. Thus, when multiplexer 500 is in the tristate mode (e.g., when signal en is low and when signal enb is high), transmission gates 620 and 630 will be turned off since the n-channel pass gate transistors will receive a low voltage while the p-channel pass gate transistors will receive a high voltage.

To ensure that the transistors in buffer stage 504 are not exposed to undue stress in the tristate mode, multiplexer 500 may be provided with aging prevention circuitry, which include transistors 622, 624, 632, and 634. N-channel transistor 622 is coupled to the gate of transistor 608 and serves to drive that gate terminal to ground during the tristate mode. P-channel transistor 624 is coupled to the gate of transistor 610 and serves to drive that gate terminal to Vdd during the tristate mode. Similarly, n-channel transistor 632 may be coupled to the gate of transistor 604 and may serve to drive that gate terminal to ground during the tristate mode. Similarly, p-channel transistor 634 may be coupled to the gate of transistor 606 and may serve to drive that gate terminal to Vdd during the tristate mode.

Configured in this way, the aging prevention transistors 622, 624, 632, and 634 all help to nullify the gate-to-source voltage (Vgs) of corresponding transistors 608, 610, 604, and 606 (e.g., the Vgs of the various pull-up and pull-down transistors in multiplexer 500 will be driven to zero volts). By tying off the gate voltages of the pull-up transistors to Vdd and by tying off the gate voltages of the pull-down transistors to Vss, the Vgs stress seen by driving transistors in multiplexer 500 is effectively eliminated. Aging prevention transistors 622, 624, 632, and 634 operated in this way are therefore sometimes referred to as "tie-off" transistors.

Figure 7:
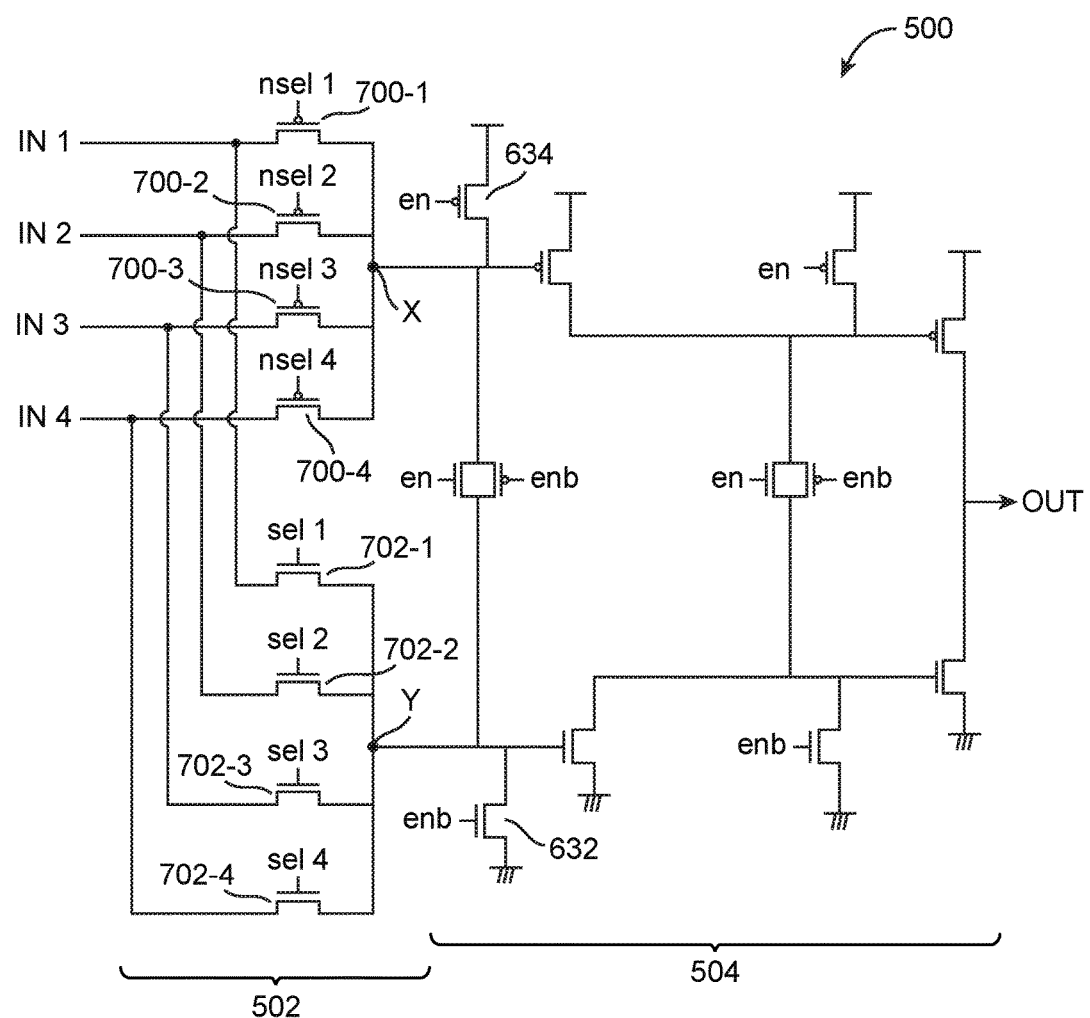

FIG. 7 shows another suitable implementation of tristate multiplexer 500. Tristate buffer stage 504 in FIG. 7 is unchanged and need not be repeated in detail. Multiplexer 500 of FIG. 7 differ from multiplexer 500 of FIG. 6 in the arrangement of input selection stage 502. In particular, stage 502 of FIG. 7 includes p-channel transistors 700-1, 700-2, 700-3, and 700-4 coupled to intermediate node X and n-channel transistors 702-1, 702-2, 702-3, and 702-4 coupled to intermediate node Y (e.g., the positions of the n-channel and p-channel pass gates are swapped).

P-channel pass transistors 700 are configured to route one of input signals IN1-IN4 to intermediate node X by selectively asserting only one of active-low signals nsel1-nsel4. Similarly, n-channel pass transistors 702 are configured to route one of input signals IN1-IN4 to intermediate node Y by selectively asserting only one of control signals sel1-sel4. Depending on the gate voltages of the multiplexer select signals and the transistor characteristics (i.e., depending on the relative mobility of n-channel vs. p-channel transistors), the speed of multiplexer 500 may be greater with a particular one of the two possible configurations of FIGS. 6 and 7.

If desired, either the n-channel or p-channel pass transistors in the input selection stage can be omitted without affecting the functionality of multiplexer 500, but at the expense of reduced speed. In other words, various embodiments that include only one of n-channel or p-channel pass transistors within multiplexer 500 can also be used. In accordance with a first variation, p-channel pass transistors 602 of FIG. 6 can be omitted. In accordance with a second variation, n-channel pass transistors 600 of FIG. 6 may be omitted. In accordance with a third variation, p-channel pass transistors 702 in FIG. 7 can be left out. In accordance with a fourth variation, n-channel pass transistors 700 in FIG. 7 need not be included. These variations are merely illustrative. If desired, other suitable ways of implementing the input stage without affecting the intended selection functionality may also be used.

Figure 8:
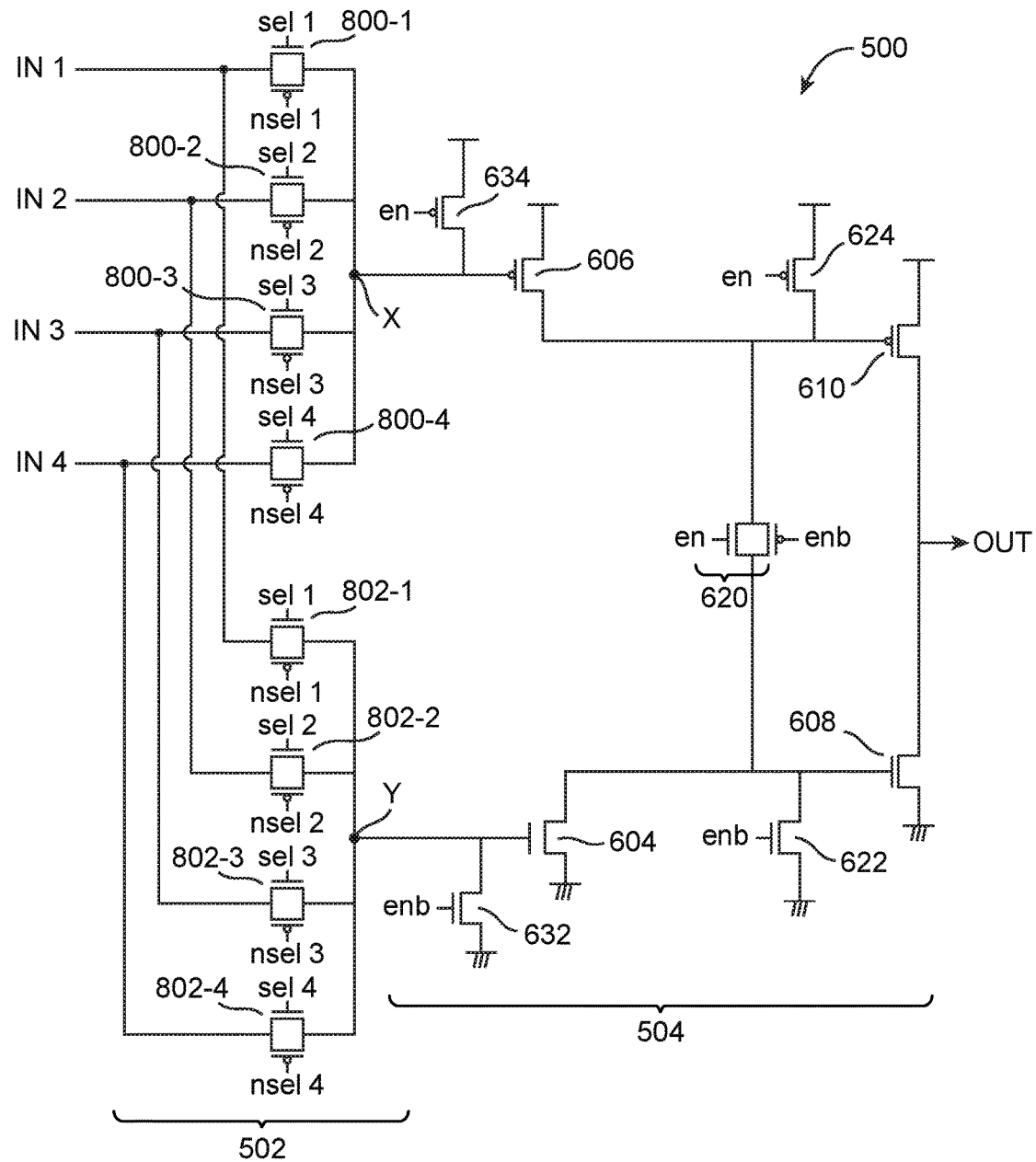

FIG. 8 shows yet another suitable implementation of tristate multiplexer 500. Elements that are the same as or similar to previously discussed elements have the same reference numbers as FIG. 6. The discussion of FIG. 8 can therefore be abbreviated and confined to just the significant differences from what has been previously explained. In particular, input selection stage 502 with two complete CMOS multiplexer portions. The first CMOS multiplexer portion may include four transmission gates 800-1, 800-2, 800-3, and 800-4, whereas the second CMOS multiplexer portion may include four transmission gates 802-1, 802-2, 802-3, and 802-4. The transmission gates 800 and 802 may be controlled by true select signals sel1-sel4 and complement select signals nsel1-nsel4.

By including full transmission gates (where each transmission gate includes an n-channel and p-channel transistor connected in parallel) instead of only n-channel or p-channel pass gates in each multiplexer portion, each CMOS multiplexer portion is able to drive nodes X and Y all the way up to Vdd and all the way down to Vss. As a result, transmission gate 630 that was previously coupled between nodes X and Y as shown in the embodiments of FIGS. 6 and 7 may be omitted from buffer stage 504.

Figure 9:
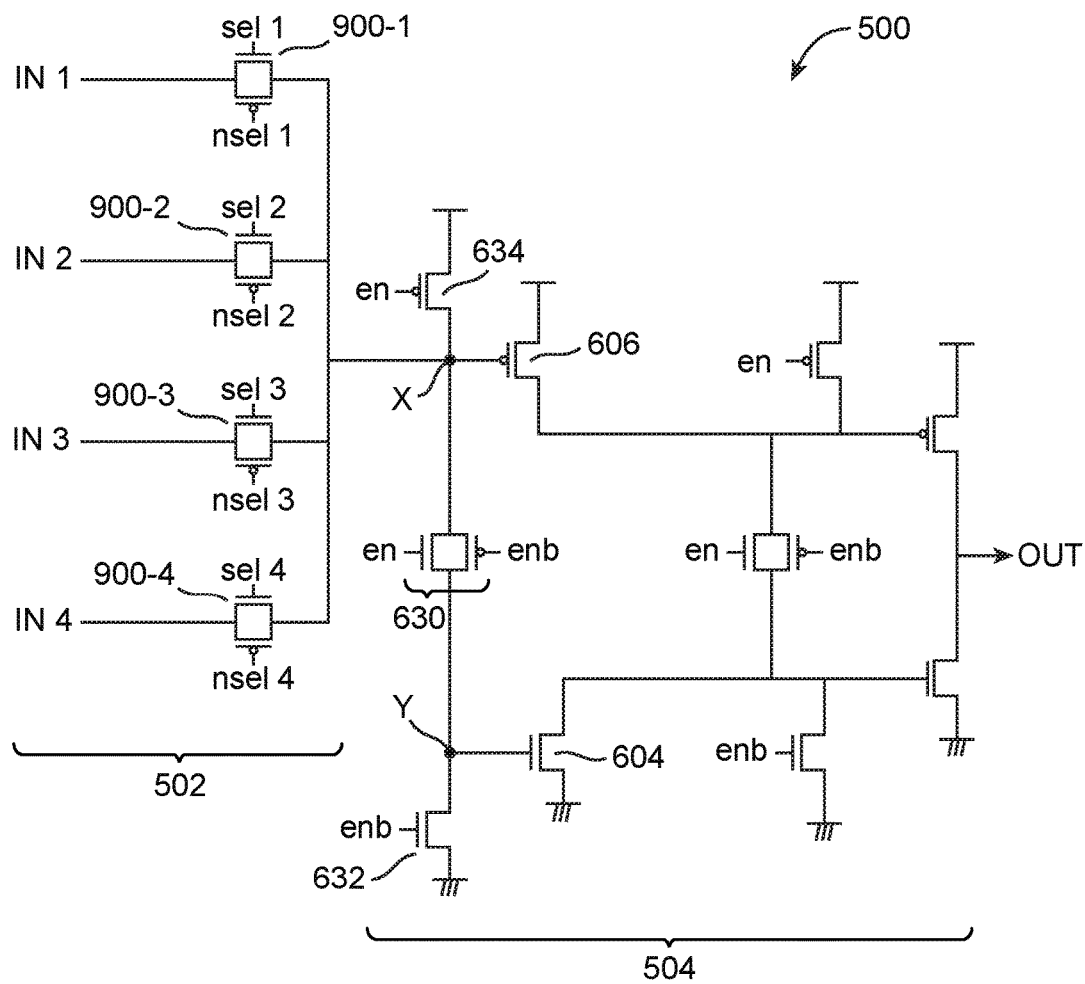

FIG. 9 shows yet another suitable arrangement of tristate multiplexer 500. In the example of FIG. 9, input selection stage 502 includes only one complete CMOS multiplexer portion. As shown in FIG. 9, four transmission gates 900-1, 900-2, 900-3, and 900-4 are coupled to node X while no input pass gates or transmission gates are directly coupled to node Y. Since no input pass transistors are connected to node Y, transmission gate 630 may have to be coupled between nodes X and Y to ensure that the gate of transistor 604 is driven to the correct voltage level. When multiplexer 500 is switched into use, transmission gate 630 may be turned on to short nodes X and Y. When multiplexer 500 is placed in tristate mode, transmission gate 630 may be deactivated to electrically isolate/decouple nodes X and Y, thereby allowing tie-off transistor 634 to drive node X all the way up to Vdd and transistor 632 to drive node Y all the way down to Vss.

The example of FIG. 9 in which multiplexer 500 includes only one CMOS multiplexer portion coupled to node X is merely illustrative. If desired, multiplexer 500 may instead include only one CMOS multiplexer portion coupled to node Y. In general, during tristate mode, all the select signals that control input selection stage 502 will be deasserted to minimize stress on the multiplexing pass transistors (e.g., signals sel1-sel4 should be driven low and signals nsel1-nsel4 should be driven high when multiplexer 500 is not in use).

Figure 10:
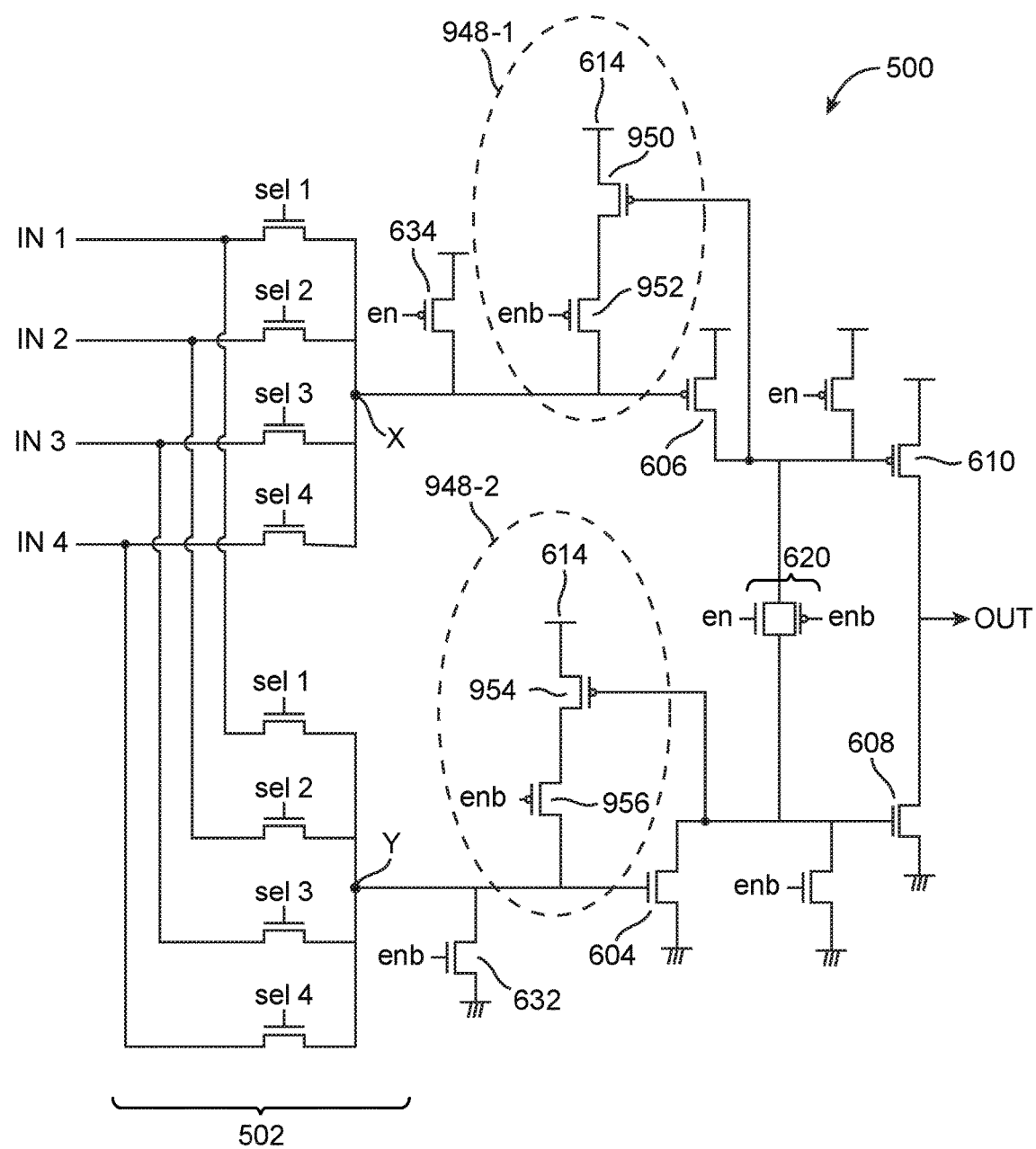

Finally, it is possible to use an NMOS only (or PMOS only) multiplexer, provided that a level restorer is included to provide a full rail logic value to the gates of the following transistors. Either a single NMOS multiplexer or two multiplexers may be used. FIG. 10 shows a version with two NMOS-only multiplexers in stage 502. As shown in FIG. 10, multiplexer 500 may be provided with level restoring circuits 948-1 and 948-2. Level restorer 948-1 may include p-channel transistors 950 and 952 coupled in series between power supply line 914 and node X. Transistor 950 may have a gate that is coupled to the gate of transistor 610, and transistor 952 may have a gate that receives signal enb. Similarly, level restorer 948-2 may include p-channel transistors 954 and 956 coupled in series between power supply line 914 and node Y. Transistor 954 may have a gate that is coupled to the gate of transistor 608, and transistor 956 may have a gate that receives signal enb. In the case that a single multiplexer is used, a transmission gate similar to 630 (see FIG. 9) is needed to couple the X and Y nodes.

Figure 11:
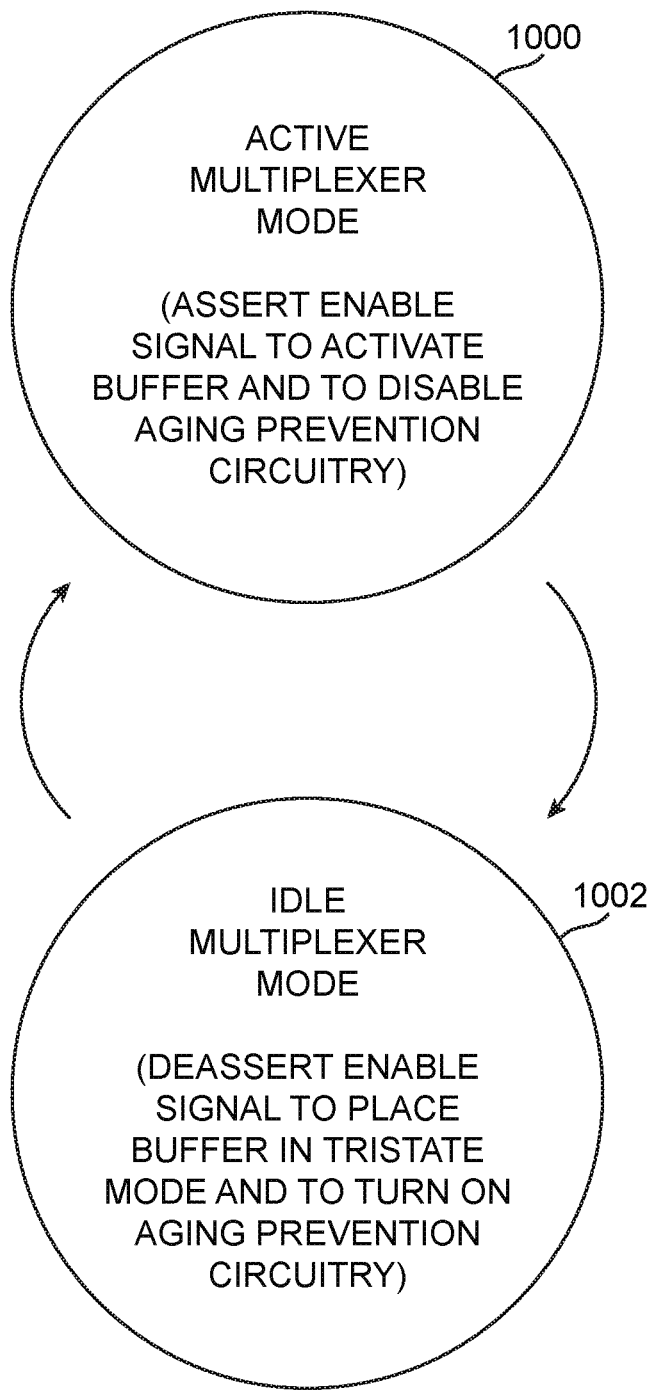
FIG. 11 is a diagram illustrating different states in which a tristate multiplexer can be operated in accordance with an embodiment.

FIG. 11 is a diagram illustrating different states in which tristate multiplexer 500 may be placed during normal operation of programmable device 10. As shown in FIG. 11, tristate multiplexer 500 may be placed in a selected one of: (1) an active multiplexer mode 1000 or (2) an idle/tristate multiplexer mode 1002.

In state 1000, enable signal en may be asserted to activate the buffer stage and to disable the aging prevention circuitry (e.g., to deactivate the tie-off transistors). In this mode, a selected user signal can be passed through to the output of multiplexer 500. In state 1002, enable signal en may be deasserted so that the buffer stage is placed in a tristate mode and to activate the tie-off transistors. In this mode, any output driving transistor in multiplexer 500 will be turned off by using the tie-off transistors to drive the Vgs of the output driving transistors to zero volts, which also minimizes any chance that multiplexer 500 will suffer from aging effects when it is not in use. Configured in this way, any multiplexing circuitry on a programmable integrated circuit can be provided with enhanced immunity to aging effects.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs). Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA/INTEL Corporation.

The foregoing is merely illustrative of the principles of this invention and various modifications can be made by those skilled in the art. The foregoing embodiments may be implemented individually or in any combination.

What is claimed is:

1. An integrated circuit, comprising:
   a multiplexing circuit operable in an active mode and a tristate mode, wherein the multiplexing circuit comprises:
   an input selection stage; and
   a tristate buffer stage that receives signals from the input selection stage and that includes driving transistors and aging prevention circuitry, wherein:
   the aging prevention circuitry nullifies any gate-to-source voltage on the driving transistors;
   the driving transistors in the tristate buffer stage includes: a first pull-down transistor with a gate terminal connected to the input selection stage, a first pull-up transistor with a gate terminal connected to the input selection stage, a second pull-down transistor with a gate terminal that is connected to the first pull-down transistor, and a second pull-up transistor with a gate terminal that is connected to the first pull-up transistor; and
   the aging prevention circuitry in the tristate buffer stage includes: a first tie-off transistor for selectively driving the gate terminal of the first pull-down transistor to a ground power supply voltage level, a second tie-off transistor for selectively driving the gate terminal of the first pull-up transistor to a positive power supply voltage level, a third tie-off transistor for selectively driving the gate terminal of the second pull-down transistor to the ground power supply voltage level, and a fourth tie-off transistor for selectively driving the gate terminal of the second pull-up transistor to the positive power supply voltage level.

2. The integrated circuit of claim 1, wherein the tristate buffer stage further comprises:
   a transmission gate coupled between the gate terminals of the first pull-down transistor and the first pull-up transistor.

3. The integrated circuit of claim 2, wherein the first and second tie-off transistors and the transmission gate are controlled by an enable signal.

4. The integrated circuit of claim 1, wherein the second pull-down transistor and the second pull-up transistor are directly connected to an output terminal of the multiplexing circuit.

5. The integrated circuit of claim 1, wherein the tristate buffer stage further comprises:
   a transmission gate coupled between the gate terminals of the second pull-down transistor and the second pull-up transistor.

6. The integrated circuit of claim 1, wherein the input selection stage comprises:
   a first group of pass transistors of a first channel type connected to the gate terminal of the first pull-up transistor; and
   a second group of pass transistors of a second channel type connected to the gate terminal of the first pull-down transistor, wherein the first and second channel types are different channel types.

7. The integrated circuit of claim 1, wherein the input selection stage comprises:
   a first group of transmission gates coupled to the gate terminal of the first pull-up transistor; and
   a second group of transmission gates coupled to the gate terminal of the first pull-down transistor.

8. An integrated circuit, comprising:
   a multiplexing circuit operable in an active mode and a tristate mode, wherein the multiplexing circuit comprises:

an input selection stage; and a tristate buffer stage that receives signals from the input selection stage and that includes driving transistors and aging prevention circuitry, wherein:

the aging prevention circuitry nullifies any gate-to-source voltage on the driving transistors;

the driving transistors in the tristate buffer stage includes: a first pull-down transistor with a gate terminal connected to the input selection stage and a first pull-up transistor with a gate terminal connected to the input selection stage; and the tristate buffer stage further comprises a level restoring circuit that is coupled to the gate terminal of the first pull-up transistor.

9. A method of operating an multiplexing circuit on an integrated circuit, comprising:

with first input selection transistors, selectively passing through a selected data signal to a first intermediate node by controlling select signals;

with second input selection transistors, selectively passing through the selected data signal to a second intermediate node that is different than the first intermediate node by controlling the select signals;

with a first tie-off transistor, selectively driving the first intermediate node to a positive power supply voltage level by controlling an enable signal that is different than the select signals;

with a second tie-off transistor, selectively driving the second intermediate node to a ground power supply voltage level by controlling the enable signal;

with a first pull-up transistor, receiving the selected data signal from the first input selection transistors;

with a first pull-down transistor, receiving the selected data signal from the second input selection transistors;

at a gate terminal of a second pull-up transistor, receiving a first voltage signal from the first pull-up transistor;

at a gate terminal of a second pull-down transistor, receiving a second voltage signal from the first pull-down transistor;

with a third tie-off transistor, selectively driving the gate terminal of the second pull-up transistor to the positive power supply voltage level; and with a fourth tie-off transistor, selectively driving the gate terminal of the second pull-down transistor to the ground power supply voltage level.

10. The method of claim 9, further comprising:

selectively shorting the first and second intermediate nodes with a transmission gate.

11. The method of claim 9, further comprising:

selectively shorting the first pull-up transistor to the first pull-down transistor with a transmission gate.

* * * * *